United States Patent
Ichikawa

(10) Patent No.: US 9,922,960 B2
(45) Date of Patent: Mar. 20, 2018

(54) PACKAGING STRUCTURE OF SUBSTRATES CONNECTED BY METAL TERMINALS

(71) Applicant: SHINKO ELECTRIC INDUSTRIES CO., LTD., Nagano (JP)

(72) Inventor: Sumihiro Ichikawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/196,170

(22) Filed: Jun. 29, 2016

(65) Prior Publication Data

US 2017/0025387 A1 Jan. 26, 2017

(30) Foreign Application Priority Data

Jul. 24, 2015 (JP) .................... 2015-146892

(51) Int. Cl.
| | |
|---|---|
| *H01L 23/48* | (2006.01) |
| *H01L 23/52* | (2006.01) |
| *H01L 29/40* | (2006.01) |
| *H01L 25/065* | (2006.01) |
| *H01L 23/00* | (2006.01) |
| *H01L 25/00* | (2006.01) |

(52) U.S. Cl.
CPC .......... *H01L 25/0657* (2013.01); *H01L 24/83* (2013.01); *H01L 25/50* (2013.01); *H01L 2224/83895* (2013.01); *H01L 2225/06513* (2013.01); *H01L 2225/06565* (2013.01); *H01L 2225/06593* (2013.01)

(58) Field of Classification Search
CPC ..... H01L 25/0657; H01L 24/83; H01L 25/50; H01L 2224/83895; H01L 2225/06524; H01L 2225/06555; H01L 2225/06593

USPC .................................... 257/737, 797
See application file for complete search history.

(56) References Cited

U.S. PATENT DOCUMENTS

| | | | | |
|---|---|---|---|---|
| 6,333,469 B1* | 12/2001 | Inoue | ................... | H01L 23/3114 174/260 |
| 6,462,420 B2* | 10/2002 | Hikita | ............... | H01L 23/49575 257/777 |
| 2006/0249859 A1* | 11/2006 | Eiles | ..................... | H01L 23/544 257/797 |
| 2008/0265436 A1* | 10/2008 | Kawabata | ............. | H01L 23/552 257/778 |
| 2009/0127705 A1* | 5/2009 | Miyata | .................... | H01L 22/34 257/737 |

FOREIGN PATENT DOCUMENTS

| | | |
|---|---|---|
| JP | 2011-159830 | 8/2011 |
| JP | 2014-072487 | 4/2014 |
| JP | 2015-008228 | 1/2015 |

\* cited by examiner

*Primary Examiner* — Dale E. Page
*Assistant Examiner* — Wilner Jean Baptiste
(74) *Attorney, Agent, or Firm* — IPUSA, PLLC

(57) ABSTRACT

A packaging structure includes a first substrate including a first metal terminal and a second metal terminal whose height is lower than the height of the first metal terminal; and a second substrate including a third metal terminal and a fourth metal terminal whose height is lower than the height of the third metal terminal, the second substrate being provided on the first substrate, the first metal terminal and the third metal terminal being directly bonded with each other, and the second metal terminal and the fourth metal terminal being bonded via a connection portion.

6 Claims, 3 Drawing Sheets

PACKAGING STRUCTURE OF SUBSTRATES CONNECTED BY METAL TERMINALS

CROSS-REFERENCE TO RELATED APPLICATIONS

The present application is based on and claims the benefit of priority of Japanese Priority Application No. 2015-146892 filed on Jul. 24, 2015, the entire contents of which are hereby incorporated by reference.

FIELD

The present invention relates to a packaging structure.

BACKGROUND

A packaging structure is known in which a first substrate including a copper terminal and a second substrate including a copper terminal are stacked, and the copper terminals are directly bonded (so-called a Cu—Cu direct bonding).

For Cu—Cu direct bonding, a method in which surfaces of the copper terminals to be bonded are activated and in which the surfaces of the copper terminals are bonded under vacuum pressure (room temperature bonding, SAB: Surface Activated Bonding), a method in which the surfaces of the copper terminals are grinded by a tool grinder or the like and in which the copper terminals are bonded under reducing atmosphere at vacuum pressure, a bonding method by generating metal salt or the like, is used.

Here, before performing the Cu—Cu direct bonding, it is necessary to align the copper terminals to be bonded. For a method of aligning the copper terminals before bonding, a method is known that uses an apparatus including an alignment device provided in a vacuum chamber, for example.

Patent Document 1: Japanese Laid-open Patent Publication No. 2015-008228

However, according to the above described alignment method, there is a problem that corrosion of the alignment device occurs in addition to a problem that the apparatus that includes the alignment device is expensive.

SUMMARY

The present invention is made in light of the above problems, and provides a packaging structure obtained by directly bonding metal terminals without using an apparatus including an alignment device.

According to an embodiment, there is provided a packaging structure including: a first substrate including a first metal terminal and a second metal terminal whose height is lower than the height of the first metal terminal, the first metal terminal and the second metal terminal being formed at a first surface of the first substrate; and a second substrate including a third metal terminal and a fourth metal terminal whose height is lower than the height of the third metal terminal, the third metal terminal and the fourth metal terminal being formed at a second surface of the second substrate, the third metal terminal being made of the same kind of metal as the first metal terminal, the second substrate being provided on the first substrate such that the second surface of the second substrate faces the first surface of the first substrate, the first metal terminal and the third metal terminal being directly bonded with each other, and the second metal terminal and the fourth metal terminal being bonded via a connection portion.

BRIEF DESCRIPTION OF DRAWINGS

Other objects, features and advantages of the present invention will become more apparent from the following detailed description when read in conjunction with the accompanying drawings.

DESCRIPTION OF EMBODIMENTS

Figure 1A:
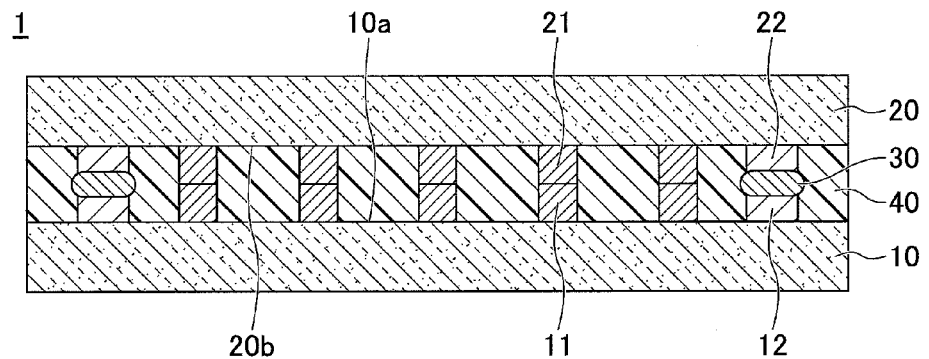
FIG. 1A and FIG. 1B are views illustrating an example of a packaging structure of an embodiment.

The invention will be described herein with reference to illustrative embodiments. It is to be noted that, in the explanation of the drawings, the same components are given the same reference numerals, and explanations are not repeated.

(Structure of Packaging Structure of Embodiment)

Figure 1B:
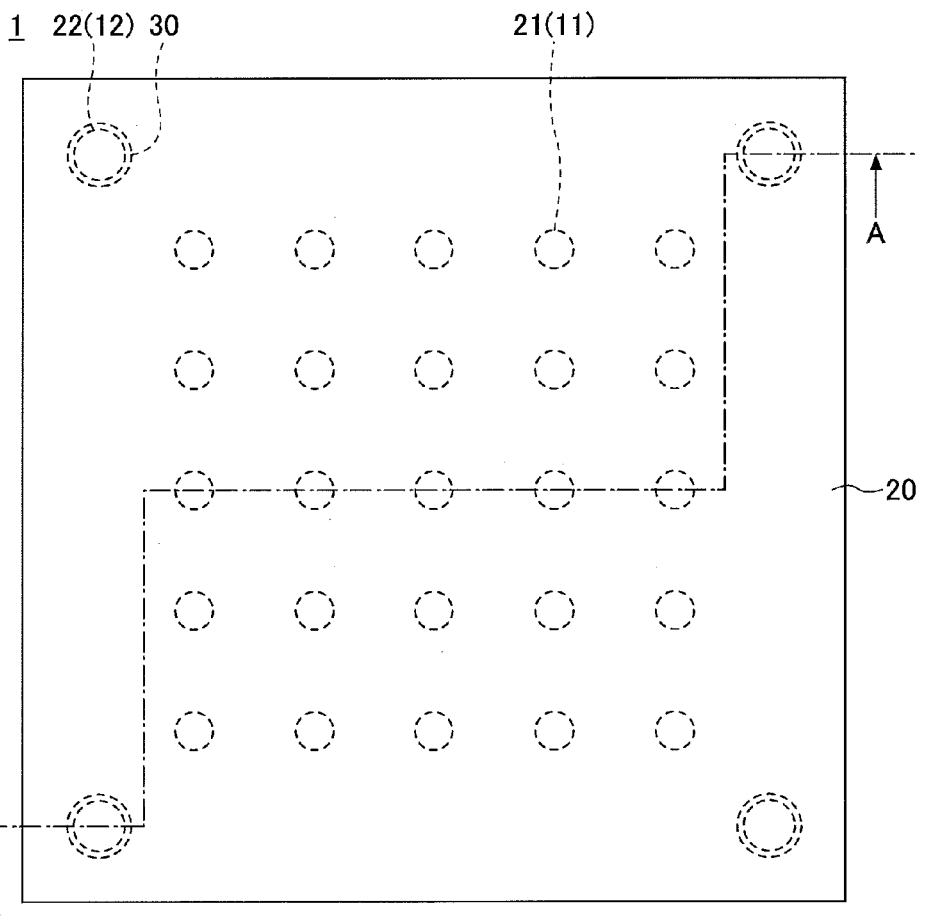

First, a structure of a packaging structure of the embodiment is described. FIG. 1A and FIG. 1B are views illustrating an example of a packaging structure 1 of the embodiment. FIG. 1B is a plan view and FIG. 1A is a cross-sectional view taken along an A-A line of FIG. 1B.

With reference to FIG. 1A and FIG. 1B, the packaging structure 1 includes a first substrate 10, a second substrate 20, connection portions 30 and a sealing portion 40. In the packaging structure 1, the second substrate 20 is stacked on the first substrate 10 such that another surface 20b (second surface) of the second substrate 20 faces one surface 10a (first surface) of the first substrate 10.

In this embodiment, a second substrate 20 side of the packaging structure 1 is referred to as an upper side or one side, and a first substrate 10 side of the packaging structure 1 is referred to as a lower side or the other side. Further, a surface of each component at the second substrate 20 side is referred to as one surface or an upper surface, and a surface at the first substrate 10 side is referred to as the other surface or a lower surface. However, the packaging structure 1 may be used in an opposite direction or may be used at an arbitrary angle. Further, in this embodiment, "in a plan view" means that an object is seen in a direction that is normal to the one surface 10a of the first substrate 10, and a "plan shape" means a shape of an object seen in the direction that is normal to the one surface 10a of the first substrate 10.

The first substrate 10 is a so-called glass epoxy substrate or the like in which insulating resin such as epoxy-based resin or the like is impregnated in a glass cloth, for example. For the first substrate 10, a resin substrate in which insulating resin such as epoxy-based resin or the like is impregnated in a woven fabric or a nonwoven fabric such as glass fiber, carbon fiber, aramid fiber or the like may be used. Further, for the first substrate 10, a silicon substrate may be used, or a ceramic substrate may be used. Further, when the first substrate 10 is the silicon substrate, a semiconductor integrated circuit may be formed in the first substrate 10. The thickness of the first substrate 10 may be about a few dozen μm to a few mm, for example.

The material and the thickness of the second substrate 20 may be the same as those of the first substrate 10, for example. Here, the first substrate 10 and the second substrate 20 may be the same kind, or may be different kinds. For example, both of the first substrate 10 and the second substrate 20 may be resin substrates, respectively, or the first substrate 10 may be a resin substrate while the second substrate 20 may be a silicon substrate.

In other words, the packaging structure 1 may be a stacked structure of wiring substrates in which none of the first substrate 10 and the second substrate 20 includes a semiconductor integrated circuit. Alternatively, the packaging structure 1 may be a stacked structure of a semiconductor chip or a semiconductor wafer that includes a semiconductor integrated circuit and a wiring substrate that does not include a semiconductor integrated circuit. In this case, one of the first substrate 10 and the second substrate 20 may be the semiconductor chip or the semiconductor wafer, and the other of the first substrate 10 and the second substrate 20 is the wiring substrate. Alternatively, the packaging structure 1 may be a stacked structure of semiconductor chips, a stacked structure of a semiconductor chip and a semiconductor wafer or a stacked structure of semiconductor wafers. In this case, each of the first substrate 10 and the second substrate 20 includes a semiconductor integrated circuit. Alternatively, the packaging structure 1 may include a plurality of one of the first substrates 10 and the second substrates 20 and a single of the other of the first substrate 10 and the second substrate 20.

A plurality of first metal terminals 11 and a plurality of second metal terminals 12, each of whose height is lower than that of the first metal terminal 11, are formed at the one surface 10a of the first substrate 10. A plurality of third metal terminals 21 and a plurality of fourth metal terminals 22, each of whose height is lower than that of the third metal terminal 21, are formed at the other surface 20b of the second substrate 20.

If the second metal terminal 12 and the fourth metal terminal 22 is longer than the first metal terminal 11 and the third metal terminal 21, respectively, the first metal terminal 11 and the third metal terminal 21 cannot be directly bonded. Meanwhile, if the second metal terminal 12 and the fourth metal terminal 22 have the same height as the first metal terminal 11 and the third metal terminal 21, respectively, the first metal terminal 11 and the third metal terminal 21 cannot be directly bonded because a difference in height is generated due to an alloy layer formed at an interface between the metal terminal (Cu) and solder, between the second metal terminal 12 and the fourth metal terminal 22. Thus, it is preferable that the height of the second metal terminal 12 and the fourth metal terminal 22 is made lower in order to allow the direct bonding between the first metal terminal 11 and the third metal terminal 21 even when the alloy layer is provided between the second metal terminal 12 and the fourth metal terminal 22.

In this embodiment, the plurality of the first metal terminals 11 and the third metal terminals 21 are provided as an area array (in a grid form) on the first substrate 10 and the second substrate 20, respectively. The first metal terminals 11 and the third metal terminals 21 face with each other, respectively. The first metal terminal 11 and the third metal terminal 21 that are facing with each other are made of the same kind of metal, and are directly bonded. For the material of the first metal terminal 11 and the third metal terminal 21, copper (Cu) may be used, for example. In such a case, the first metal terminal 11 and the third metal terminal 21 are bonded by a so-called Cu—Cu direct bonding. Here, the material of the first metal terminal 11 and the third metal terminal 21 may be the same kind of metal other than copper (Cu) as long as the first metal terminal 11 and the third metal terminal 21 can be directly bonded. Other than copper (Cu), nickel (Ni), silver (Ag), indium (In), tin (Sn) or the like may be used, for example.

The plurality of the second metal terminals 12 and the fourth metal terminals 22 are provided at an area that is a further outer periphery side of an area at which the first metal terminals 11 and the third metal terminals 21 are provided, for example. The second metal terminals 12 and the fourth metal terminals 22 face with each other, respectively. The first substrate 10 and the second substrate 20 are rectangular in FIG. 1B, respectively, and the second metal terminals 12 and the fourth metal terminals 22 are provided at four corners of the first substrate 10 and the second substrate 20, respectively. Here, the packaging structure 1 may include at least two of the second metal terminals 12 and two of the fourth metal terminals 22. The number of each of the second metal terminals 12 and the fourth metal terminals 22 may be three, or five or more.

Here, when the first substrate 10 and the second substrate 20 are rectangular, it is preferable that all of or a part of the second metal terminals 12 and the fourth metal terminals 22 are provided on a diagonal line of the rectangular, respectively. As will be described later, the second metal terminal 12 and the fourth metal terminal 22 are terminals used for a self-alignment, and with this configuration, an accurate self-alignment can be actualized.

The second metal terminal 12 and the fourth metal terminal 22 are connected via the connection portion 30. For the connection portion 30, low temperature solder may be used, for example. In this embodiment, the low temperature solder means solder whose melting point is less than 200° C. As an example of the low temperature solder, SnBi, SnZn, In, or the like may be used.

For the material of the second metal terminal 12 and the fourth metal terminal 22, any metals capable of being connected by the low temperature solder may be used. However, it is preferable that the metal (Cu, for example) that is the same kind as the metal of the first metal terminal 11 and the third metal terminal 21 is used for the second metal terminal 12 and the fourth metal terminal 22 because the manufacturing steps of the metal terminals can be simplified.

Further, if the second metal terminal 12 and the fourth metal terminal 22 are made of a metal different from the metal composing the first metal terminal 11 and the third metal terminal 21, there is a risk that an alignment accuracy is lowered because the second metal terminal 12 and the fourth metal terminal 22 are influenced by the bonding condition of the first metal terminal 11 and the third metal terminal 21. However, by composing the second metal terminal 12 and the fourth metal terminal 22 by the same kind of metal as that of the first metal terminal 11 and the third metal terminal 21, the second metal terminal 12 and the fourth metal terminal 22 can endure the bonding condition of the first metal terminal 11 and the third metal terminal 21. Thus, lowering of the alignment accuracy can be prevented.

The first metal terminal 11 and the third metal terminal 21 may have a cylindrical shape, for example. The height of the first metal terminal 11 and the third metal terminal 21 may be about 5 µm to 500 µm, for example. The second metal terminal 12 and the fourth metal terminal 22 may have a cylindrical shape, for example. The height of the second metal terminal 12 and the fourth metal terminal 22 may be lower than that of the first metal terminal 11 and the third metal terminal 21 for about 1 µm to 100 µm, respectively, for example.

When the first metal terminal 11 and the third metal terminal 21 have a cylindrical shape, respectively, the diameter of an end surface of the cylindrical may be about 5 μm to a few dozen μm, for example. When the second metal terminal 12 and the fourth metal terminal 22 have a cylindrical shape, the diameter of an end surface of the cylindrical may be the same as or greater than the diameter of the end surface of the cylindrical of the first metal terminal 11 and the third metal terminal 21, respectively, for example. The pitch of the first metal terminals 11 and the third metal terminals 21 may be about 20 μm to a few hundred μm, respectively, for example.

The sealing portion 40 is formed between the one surface 10a of the first substrate 10 and the other surface 20b of the second substrate 20 so as to cover the first metal terminals 11, the second metal terminals 12, the third metal terminals 21, the fourth metal terminals 22 and the connection portions 30. The sealing portion 40 is so-called underfill resin, and may be insulating resin such as thermosetting epoxy-based resin or the like, for example. The sealing portion 40 may include fillers such as silica ($SiO_2$) or the like.

(Method of Manufacturing Packaging Structure of Embodiment)

Next, a method of manufacturing the packaging structure 1 of the embodiment is described. FIG. 2A to FIG. 3C are views illustrating an example of manufacturing steps of the packaging structure 1 of the embodiment. Here, FIG. 2A to FIG. 3C illustrate cross-sections corresponding to the cross-section of FIG. 1A, respectively.

Figure 2A:
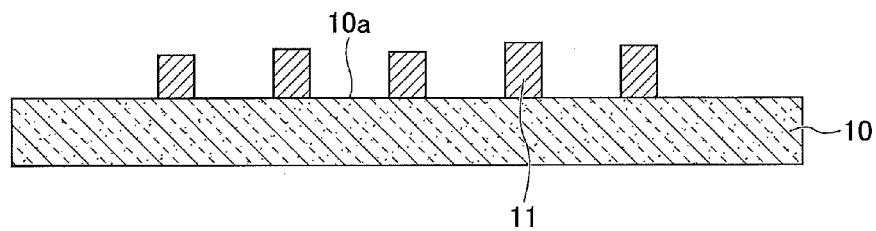
FIG. 2A to FIG. 2D are views illustrating an example of manufacturing steps of the packaging structure of the embodiment.

First, in a step illustrated in FIG. 2A, the first substrate 10 such as a resin substrate, a silicon substrate or the like is prepared and the first metal terminals 11 are formed at the one surface 10a of the first substrate 10. For the material of the first metal terminals 11, copper (Cu) may be used, for example. The first metal terminals 11 may be formed by a semi-additive process, for example. Here, in this step, there is a case that the heights of the first metal terminals 11 are not the same.

Figure 2B:
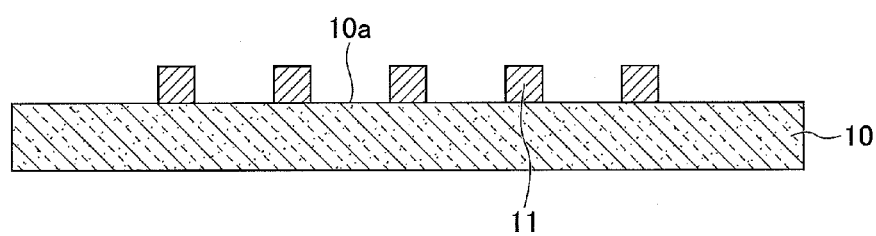

Next, in a step illustrated in FIG. 2B, front end sides of the first metal terminals 11 are grinded by polishing or grinding to make the heights of the first metal terminals 11 to be equal, and also planarizing and activating the upper end surfaces of the first metal terminals 11. For polishing or grinding, Chemical Mechanical Polishing (CMP), a tool grinder or the like may be used, for example.

Figure 2C:
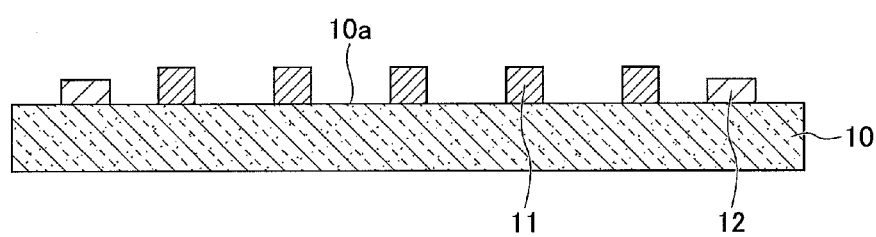

Next, in a step illustrated in FIG. 2C, a plurality of the second metal terminals 12 are formed at an area of the one surface 10a of the first substrate 10 that is an outer periphery side of an area at which the first metal terminals 11 are provided. The second metal terminals 12 may be provided at four corners or on a diagonal line of the one surface 10a of the first substrate 10, for example. For the material of the second metal terminals 12, any metals capable of being connected by the low temperature solder may be used. However, it is preferable that the metal (Cu, for example) that is the same kind as the metal of the first metal terminals 11 is used because the manufacturing steps of the metal terminals can be simplified. The second metal terminals 12 may be formed by a semi-additive process, for example. Here, the second metal terminals 12 may be formed such that the height of the second metal terminals 12 is lower than the height of the first metal terminals 11.

Figure 2D:
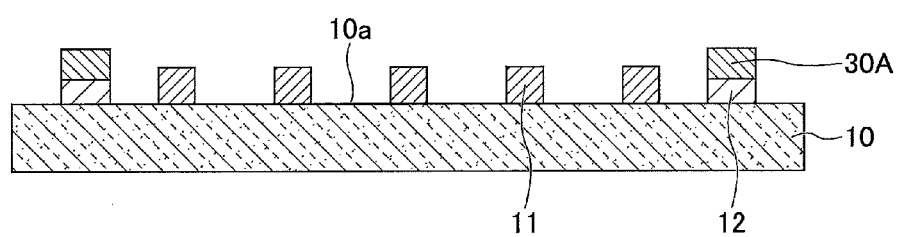

Next, in a step illustrated in FIG. 2D, the first connection portions 30A are formed at the upper end surfaces of the second metal terminals 12, respectively. For the material of the first connection portions 30A, low temperature solder such as SnBi, SnZn, In, or the like may be used, for example.

The first connection portions 30A may be formed by a semi-additive process, for example. It is preferable that the first connection portions 30A are formed such that the total height of the second metal terminal 12 and the first connection portion 30A becomes higher than the height of the first metal terminals 11.

Here, the steps of FIG. 2C and FIG. 2D may be continuous steps. This means that when forming the second metal terminals 12 by a semi-additive process, a resist provided with openings formed at parts corresponding to the second metal terminals 12 is formed on a seed layer formed on the one surface 10a of the first substrate 10. At this time, the resist is not removed after forming the second metal terminals 12. Then, the first connection portions 30A are formed on the upper end surface of the second metal terminal 12 in each of the openings by electrolysis plating. Thereafter, the resist and an unnecessary part of the seed layer are removed.

Alternatively, the first connection portions 30A may be formed by printing, or formed by mounting solder balls. In such a case, the steps of FIG. 2C and FIG. 2D are separately performed.

Figure 3A:
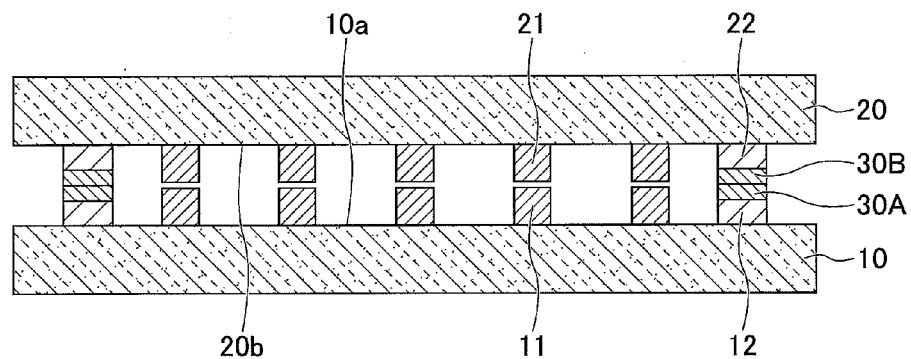
FIG. 3A to FIG. 3C are views illustrating an example of manufacturing steps of the packaging structure of the embodiment.

Next, in a step illustrated in FIG. 3A, similar to the steps of FIG. 2A to FIG. 2C, the second substrate 20 is manufactured in which the third metal terminals 21 and the fourth metal terminals 22, each of whose height is lower than the height of the third metal terminal 21, are formed at the other surface 20b. Then, similar to the step of FIG. 2D, the second connection portions 30B are formed at lower end surfaces of the fourth metal terminals 22, respectively. Here, for the material of the third metal terminal 21, the same kind of metal as the first metal terminals 11 is used. For example, if the first metal terminals 11 are made of copper (Cu), the third metal terminals 21 are also made of copper (Cu). For the material of the fourth metal terminals 22, any metals capable of being connected by the low temperature solder may be used. However, it is preferable that the metal (Cu, for example) that is the same kind as the metal of the third metal terminals 21 is used because the manufacturing steps of the metal terminals can be simplified. For the material of the second connection portions 30B, low temperature solder such as SnBi, SnZn, In, or the like may be used, for example.

Then, the second substrate 20 is stacked on the first substrate 10 such that the upper end surfaces of the first metal terminals 11 and the lower end surfaces of the third metal terminals 21 face with each other, and the upper end surfaces of the first connection portions 30A and the lower end surfaces of the second connection portions 30B face with each other, respectively. Thereafter, the upper end surfaces of the first connection portions 30A and the lower end surfaces of the second connection portions 30B are temporarily fixed by scrubbing (sliding) or supersonic. At this time, there is a case that a slight space is formed between each combination of the upper end surface of the first metal terminal 11 and the lower end surface of the third metal terminal 21. Further, there is a case that an oxide film is formed at the upper end surface of the first metal terminal 11 and at the lower end surface of the third metal terminal 21.

Figure 3B:
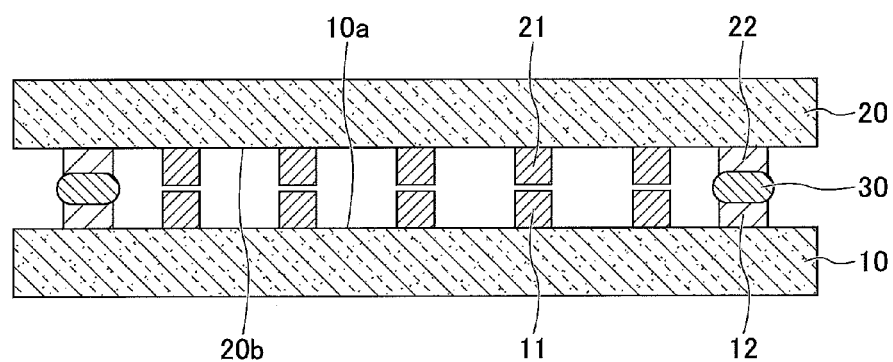

Next, in a step illustrated in FIG. 3B, the first connection portions 30A and the second connection portions 30B are heated to temperature that is greater than or equal to the melting point of the low temperature solders that constitute the first connection portions 30A and the second connection portions 30B, respectively, in reducing atmosphere such as formic acid atmosphere, hydrogen radical atmosphere or the like. With this, the first connection portions 30A and the second connection portions 30B melt to be integrally formed into the connection portions 30. Further, at this time, due to the surface tension of the melted connection portions 30, the first metal terminals 11 and the third metal terminals 21 are self-aligned, respectively. Further, an oxide film formed at the upper end surface of the first metal terminal 11 and at the lower end surface of the third metal terminal 21 is removed by the reducing material such as formic acid or the like. Here, if there is a slight space between the upper end surface of the first metal terminal 11 and the lower end surface of the third metal terminal 21, the reducing material such as formic acid or the like enters from the space to remove the oxide film.

If there is no space, the oxide film between the upper end surface of the first metal terminal 11 and the lower end surface of the third metal terminal 21 is not completely removed. Thus, it is difficult to bond the upper end surface of the first metal terminal 11 and the lower end surface of the third metal terminal 21 in the step illustrated in FIG. 3C. Further, in accordance with miniaturization of wirings, there is a problem of electrical resistance by an oxide film. Thus, in this embodiment, the connection portions 30 are provided in order to form a space, even if it is very small, between each combination of the first metal terminal 11 and the third metal terminal 21 to remove the oxide film and to improve reliability in connection.

Here, if the first connection portions 30A and the second connection portions 30B are not made of low temperature solder (if the melting point is higher than 200° C.), it is necessary to heat the first connection portions 30A and the second connection portions 30B to be higher than 200° C. in this step. Further, in addition to the problem of the oxide film, if the temperature is greater than 200° C. in an environment, crystallization of copper that composes the first metal terminals 11 and the third metal terminals 21 proceeds and there is another problem that the active state (microcrystal) necessary for directly bonding the first metal terminals 11 and the third metal terminals 21, respectively, cannot be maintained.

Thus, in this embodiment, the first connection portions 30A and the second connection portions 30B are made of low temperature solder, and the first metal terminals 11 and the third metal terminals 21 are bonded under a low temperature environment by suppressing the heating temperature to be less than or equal to 200° C. for maintaining the active state (microcrystal) necessary for directly bonding the first metal terminals 11 and the third metal terminals 21, respectively. With this, the upper end surfaces of the first metal terminals 11 and the lower end surfaces of the third metal terminals 21 can be bonded with high reliability in the step illustrated in FIG. 3C.

Figure 3C:
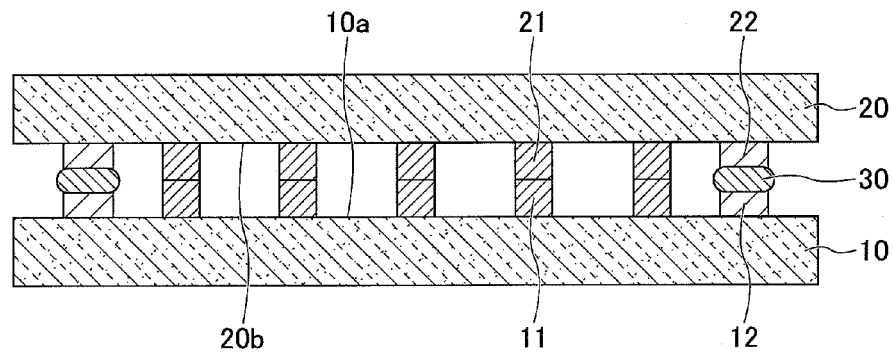

Next, in a step illustrated in FIG. 3C, the second substrate 20 is pushed toward the first substrate 10 under the reducing atmosphere similar to that of the step illustrated in FIG. 3B, and the upper end surfaces of the first metal terminals 11 and the lower end surfaces of the third metal terminals 21 are directly bonded by a thermal compression bonding, respectively. When the materials of the first metal terminals 11 and the third metal terminals 21 are copper (Cu), the first metal terminals 11 and the third metal terminals 21 are connected by a so-called Cu—Cu direct bonding. Thereafter, by returning to room temperature, the connection portions 30 are solidified, and the second metal terminals 12 and the fourth metal terminals 22 are bonded via the connection portions 30, respectively.

After the step illustrated in FIG. 3C, the sealing portion 40 is formed by filling insulating resin such as thermosetting epoxy-based resin or the like between the one surface 10a of the first substrate 10 and the other surface 20b of the second substrate 20, and curing the insulating resin. With this, the packaging structure 1 illustrated in FIG. 1A and FIG. 1B is completed.

As such, in this embodiment, a self-alignment method using low temperature solder is used for a method of aligning metal terminals when directly bonding the metal terminals. With this, the metal terminals can be accurately aligned without using an expensive apparatus including an alignment device. Here, an apparatus that heats low temperature solder under reducing atmosphere such as formic acid atmosphere, hydrogen radical atmosphere or the like, which does not include an alignment device, is inexpensive.

Further, in this embodiment, a step of temporarily fixing the connection portions is performed before the step of directly bonding the terminals. With this, even when bonding a plurality of individualized semiconductor chips on a semiconductor wafer, for example, by temporarily fixing the individualized semiconductor chips with the semiconductor wafer at an appropriate position, the semiconductor chips and the semiconductor wafer can be proceeded to the bonding step without causing a positional shift. Further, as the positional shift between the terminals that face with each other after being bonded is reduced, the contacting area between these terminals can be largely ensured and cracking, electrical resistance or the like due to stress can be reduced.

According to the embodiment, a packaging structure obtained by directly bonding metal terminals without using an apparatus including an alignment device can be provided.

Although a preferred embodiment of the packaging structure has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

Various aspects of the subject-matter described herein are set out non-exhaustively in the following numbered clauses:

1. A method of manufacturing a packaging structure including:

preparing a first substrate including a first metal terminal and a second metal terminal whose height is lower than the height of the first metal terminal, the first metal terminal and the second metal terminal being formed at a first surface of the first substrate;

preparing a second substrate including a third metal terminal and a fourth metal terminal whose height is lower than the height of the third metal terminal, the third metal terminal and the fourth metal terminal being formed at a second surface of the second substrate, the third metal terminal being made of the same kind of metal as the first metal terminal;

forming a first connection portion on the second metal terminal and forming a second connection portion on the fourth metal terminal;

stacking the second substrate on the first substrate such that an end surface of the first metal terminal faces an end surface of the third metal terminal and an end surface of the first connection portion faces an end surface of the second connection portion, temporarily fixing the end surface of the first connection portion and the end surface of the second connection portion;

melting the first connection portion and the second connection portion, self-aligning the first metal terminal and the third metal terminal, and removing oxide films at the end surface of the first metal terminal and the end surface of the third metal terminal;

directly bonding the end surface of the first metal terminal and the end surface of the third metal terminal by pushing the second substrate toward the first substrate while the first connection portion and the second connection portion are melted; and solidifying the first connection portion and the second connection portion and connecting the second metal terminal and the fourth metal terminal via the solidified connection portion.

2. The method of manufacturing the packaging structure according to clause 1, wherein the steps of self-aligning, directly bonding, and connecting the second metal terminal and the fourth metal terminal via the solidified connection portion are performed under reducing atmosphere.

3. The method of manufacturing the packaging structure according to clause 1, further including activating the end surface of the first metal terminal and the end surface of the third metal terminal by polishing or grinding prior to the step of stacking.

4. The method of manufacturing the packaging structure according to clause 1, wherein the second metal terminal and the fourth metal terminal are made of a metal that is the same kind as the metal composing the first metal terminal and the third metal terminal.

5. The method of manufacturing the packaging structure according to clause 1, wherein the first connection portion and the second connection portion are made of solder whose melting point is less than 200° C.

What is claimed is:

1. A packaging structure comprising:
a first substrate including a first metal terminal and a second metal terminal whose height is lower than the height of the first metal terminal, the first metal terminal and the second metal terminal being formed at a first planar surface of the first substrate; and
a second substrate including a third metal terminal and a fourth metal terminal whose height is lower than the height of the third metal terminal, the third metal terminal and the fourth metal terminal being formed at a second planar surface of the second substrate, the third metal terminal being made of the same kind of metal as the first metal terminal, the second substrate being provided on the first substrate such that the second planar surface of the second substrate faces the first planar surface of the first substrate, only the first metal terminal and the third metal terminal being directly bonded with each other, while the second metal terminal and the fourth metal terminal are bonded via a connection portion.

2. The packaging structure according to claim 1, further comprising a plurality of the second metal terminals and a plurality of the fourth metal terminals,
wherein the plurality of second metal terminals and the plurality of fourth metal terminals are provided at an area that is an outer periphery side of an area at which the first metal terminal and the third metal terminal are provided, in a plan view.

3. The packaging structure according to claim 2,
wherein each of the first substrate and the second substrate is rectangular, in a plan view, and
wherein all of or a part of the second metal terminals and all of or a part of the fourth metal terminals are placed on a diagonal line of the rectangular of the first substrate and the second substrate, respectively, in a plan view.

4. The packaging structure according to claim 1, wherein the second metal terminal and the fourth metal terminal are made of the same kind of metal as the first metal terminal and the third metal terminal.

5. The packaging structure according to claim 1, wherein the connection portion is made of solder whose melting point is less than 200° C.

6. The packaging structure according to claim 1, wherein the planar size of each of the second metal terminal and the fourth metal terminal is larger than the planar size of each of the first metal terminal and the third metal terminal, respectively.

* * * * *